Oct. 5, 1965 D. A. PAY 3,210,683

VARIABLE GAIN CIRCUIT ARRANGEMENTS

Filed Dec. 21, 1961

INVENTOR
Donald Alexander Pay
BY Baldwin & Wight
ATTORNEYS

United States Patent Office 3,210,683
Patented Oct. 5, 1965

3,210,683
VARIABLE GAIN CIRCUIT ARRANGEMENTS
Donald Alexander Pay, West Hanningfield, Essex, England, assignor to The Marconi Company Limited, a British company
Filed Dec. 21, 1961, Ser. No. 161,184
Claims priority, application Great Britain, Jan. 13, 1961, 1,520/61
7 Claims. (Cl. 330—71)

Figure 1:
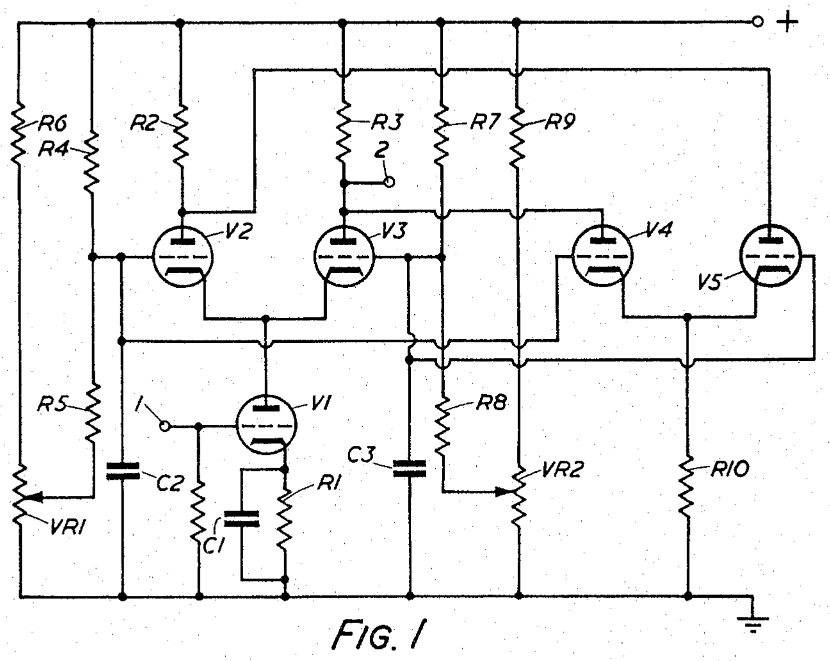

This invention relates to variable gain circuit arrangements and more particularly, although not exclusively, to television signal faders. It is the main object of the invention to provide improved variable gain circuit arrangements which are capable of being remotely controlled.

According to this invention in its broadest aspect a variable gain circuit arrangement includes three signal controllable amplifier devices, two of which are in parallel circuits and together are connected in series with the third device, means for applying input signals to be amplified to control the said third device, means for controlling, in dependence on desired gain, the relative internal impedances of said two devices and means for taking off gain controlled output signals from at least one of said two devices.

In a preferred type of embodiment there are three valves, the third of which is connected in the cathode return circuit of the other two valves, input signals to be amplified are applied to the control grid of the third valve, gain control potential is applied to a grid of one of the other two valves and output is taken from the output electrode, in series with which is a load impedance, of one or the other of said two valves.

According to a feature of this invention a variable gain circuit arrangement includes three signal controllable amplifier devices, two of which are in parallel circuits and together are connected in series with the third device, means for applying input signals to be amplified to control the said third device, means for controlling, in dependence on desired gain, the relative internal impedances of said two devices, means for taking off gain controlled output signals from at least one of said two devices, a further signal controllable amplifier device, a load which is common to said one device and said further device and means for controlling the internal impedance of said further device in accordance with that of the other one of said two devices.

Preferably said further device has its output electrode connected to the output electrode of said one of said two devices and has its control electrode connected to the control electrode of the other one of said two devices. Preferably there is an additional signal controllable amplifier device having its control electrode connected to the control electrode of said one of said two devices and its output electrode connected to the output electrode of the other device, said additional device and said further device being together connected, through an impedance, to a point of reference potential to which said third device is also connected.

In a preferred embodiment there are two pairs of valves, each valve of one pair having its anode connected to a separate load device and to the anode of a different one of the valves of the other pair and its control grid connected to the control grid of the other valve of the other pair, a further valve connected in the cathode return circuit of one of said pairs and an impedance connected in the cathode return circuit of the other pair, means for applying input signals to be amplified to the control grid of said further valve, means for applying gain control potential to the inter-connected control grids of one valve of each pair to provide relative changes of signal amplitude at the separate load devices, and means for taking off gain controlled output signals from the junction of the inter-connected anodes of one valve of each pair from said load device therefor.

Where it is desired to provide a cross-fader, i.e. a device providing an output signal which comprises one or the other, or a complementary mixture of, two input signals, said impedance is constituted by an additional valve and means are provided for applying further input signals to the control grid thereof, whereby the output signals of the device comprise a complementary mixture of said further input signals and said first-mentioned input signals.

Figure 2:
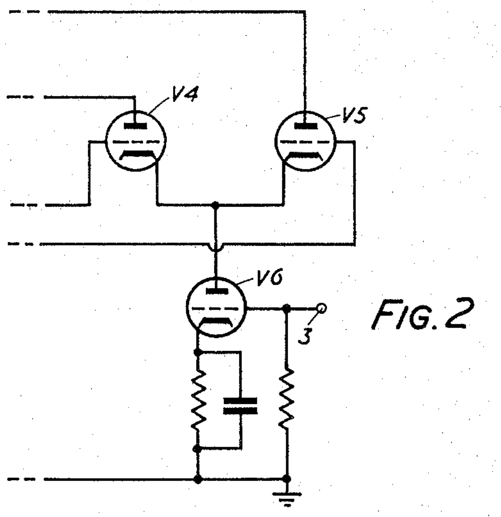

The invention is illustrated in and further described with reference to the accompanying drawings in which FIGURE 1 shows one embodiment and FIGURE 2 shows, so far as is necessary to an understanding thereof, a modification of the arrangement of FIGURE 1.

Referring to FIGURE 1 valve V1 has its cathode connected to earth through a resistance R1 and by-pass condenser C1 while its anode is directly connected to the cathodes of two similar valves V2 and V3 whose anodes are independently connected via anode load resistances R2 and R3 to the positive terminal of a source (not shown) of potential.

An adjustable D.C. potential is applied to the control grid of V2 by means of fixed resistances R4, R5 and R6 and potentiometer VR1 and an adjustable D.C. potential is likewise applied to the control grid of V3 by means of fixed resistances R7, R8 and R9 and potentiometer VR2. The control grids of valves V2 and V3 are also connected to earth via condensers C2 and C3, respectively, which are such as to decouple the grids from stray signals which might be picked up.

As so far described the circuit constitutes a signal fader in which signals to be controlled are applied to terminal 1, and hence to the control grid of valve V1, and output signals are taken from the anode of valve V3 at terminal 2. In practice, gain control of the output signals is obtained by adjustment of potentiometer VR1, while potentiometer VR2 is preferably pre-set so that the value of the output signals from the anode of valve V3 just reaches zero when the gain controlling potentiometer VR1 reaches its minimum setting. It will be seen that signal currents through valve V1 will divide at the anode of V1, some of the current taking the path through valve V2 and some through valve V3, depending on the relative impedances of these paths. Thus, as the internal impedance of valve V2 is varied by variation of potentiometer VR1 the relative proportions of the impedances, and hence of the signal currents, in the two aforesaid paths will vary and hence variation in the amplitude of the output signals will occur.

Clearly, if desired, gain control could be exercised by operating both potentiometers VR1 and VR2 in complementary fashion but this arrangement is not preferred due to its added complexity.

The arrangement for providing a control potential at the grid of valve V2 need not, of course, be constituted by a potentiometer device but may comprise, for example, a source of A.G.C. potential whereby the level of output signals at terminal 2 is automatically controlled.

As so far described the arrangement suffers from the defect which may be serious in some applications, that variation of the control potential at the grid of valve V2 also causes a change in the average D.C. current through valve V3 and hence causes an undesirable component of voltage to appear at the anode of V3.

This defect is overcome by the provision of a further signal controllable amplifier device comprising a valve V4 and an additional signal controllable amplifier device comprising a valve V5. The two valves V4 and V5 are similar to valves V2 and V3, valve V4 having its anode connected to the anode of V3 and its grid connected to the grid of V2, while valve V5 has its anode connected to the anode of V2 and its grid connected to the grid of V3, the cathodes of both valves V4 and V5 being commonly connected through resistance R10 to earth. Resistance R10 is chosen to have a value substantially equal to the effective resistance of valve V1 together with its cathode load and with this arrangement it will be seen that the aforesaid undesirable voltage component in the output signal at terminal 2 due to valve V3 is compensated by complementary changes due to valve V4. R10 or a part thereof may conveniently be made variable so that the circuit balance may be adjusted to give maximum compensation. Valve V5 is not a theoretical necessity but its inclusion by permitting a more effective duplication of the arrangement of valves V1, V2 and V3, makes for simplicity.

FIGURE 2 shows, so far as is necessary for an understanding thereof, a modification of the arrangement of FIGURE 1 and which may be used as a cross fader. For simplicity in drawing only that part of the arrangement of FIGURE 1 which carries the modification is shown, the modification consisting of the replacement of resistance R10 by the additional valve V6 which is similar to valve V1 and is similarly connected.

A second set of input signals is applied to terminal 3 and it will be clear, in view of the foregoing description, that the output signals at terminal 2 will be a complementary mixture of the input signals applied at terminals 1 and 3. The range of control potential applicable to the grids of valves V2 and V4 is arranged to be such that either set of input signals may be effectively excluded from the output signals.

In the illustrated embodiments transistors may be used wherever valves are shown with only such well-known changes of circuit detail as are involved in the substitution of transistors for valves.

I claim:

1. A variable gain circuit arrangement including three signal controllable amplifier devices, two of which have a common cathode connection and are connected in series with the third device to provide two alternative paths for signals from the third device, means for applying input signals to be amplified to an input terminal of said third device, gain control means connected to at least one of said two amplifier devices for controlling, in dependence on desired gain, the relative internal impedances of said two devices, and means for taking off gain controlled output signals exclusively from one of said two devices.

2. A variable gain circuit arrangement including three signal controllable amplifier devices, two of which have a common cathode connection and are connected in series with the third device to provide two alternative paths for signals from the third device, means for applying input signals to be amplified to an input terminal of said third device, gain control means connected to at least one of said two amplifier devices for controlling, in dependance on desired gain, the relative internal impedances of said two devices, means for taking off gain controlled output signals exclusively from one of said two devices, a further signal controllable amplifier device, a load which is common to said one device and said further device and means for controlling the internal impedance of said further device in accordance with that of the other of said two devices.

3. A circuit arrangement as claimed in claim 2 wherein said further device has its output electrode connected to the output electrode of said one of said two devices and has its control electrode connected to the control electrode of the other one of said two devices.

4. A variable gain circuit arrangement comprising two pairs of valves, each valve of one pair having its anode connected to a separate load device and to the anode of a different one of the valves of the other pair and having its control grid connected to the control grid of the other valve of the other pair, a further valve connected in the cathode return circuit of one of said pairs and an impedance connected in the cathode return circuit of the other pair, means for applying input signals to be amplified to the control grid of said further valve, means for applying gain control potential to the inter-connected control grids of one valve of each pair to provide relative changes of signal amplitude at the separate load devices, and means for taking off gain controlled output signals from the junction of the inter-connected anodes of one valve of each pair from said load device.

5. A variable gain circuit arrangement comprising three signal controllable amplifier valves, two of which have a common cathode connection and are connected in series with the third valve to provide two alternative paths for signals from the third valve, said third valve being connected in the cathode return circuit of said two valves, means for applying input signals to be amplified to a control grid of said third valve, gain control means for controlling, in dependence on desired gain, the relative internal impedances of said two valves, said gain control means including means for applying gain control potential to a control grid of at least one of said two valves, and means for taking off gain controlled output signals exclusively from one of said two valves.

6. A variable gain circuit arrangement including three signal controllable amplifier devices, two of which have a common cathode connection and are connected in series with the third device to provide two alternative paths for signals from the third device, means for applying input signals to be amplified to an input terminal of said third device, gain control means connected to at least one of said two amplifier devices for controlling, in dependence on desired gain, the relative internal impedances of said two devices, means for taking off gain controlled output signals exclusively from one of said two devices, a further signal controllable amplifier device, a load which is common to said one device and said further device, means for controlling the internal impedance of said further device in accordance with that of the other one of said two devices, an additional signal controllable amplifier device having its control electrode connected to the control electrode of said one of said two devices and its output electrode connected to the output electrode of the other one of said two devices, and means for connecting both said additional device and said further device through an impedance to a point of reference potential to which said third device is connected.

7. A variable gain circuit arrangement providing an output signal which comprises at least one of two input signals, said circuit arrangement including two pairs of valves, each valve of one pair having its anode connected to a separate load device and to the anode of a different one of the valves of the other pair and having its control grid connected to the control grid of the other valve of the other pair, a further valve connected in the cathode return circuit of one of said pairs and an additional valve connected in the cathode return circuit of the other pair, means for applying one of the input signals to be amplified to the control grid of said further valve, means for applying the other input signal to the control grid of said additional valve, means for applying gain control potential to the inter-connected control grids of one valve of each pair to provide relative changes of signal amplitude at the separate load devices, and means for taking off gain controlled output signals from the junction of the inter-connected anodes of one valve of each pair from said load device therefor.

References Cited by the Examiner

UNITED STATES PATENTS 2,702,857 2/55 Berger ---------------- 330—71 X

FOREIGN PATENTS 672,256 5/52 Great Britain.

ROY LAKE, *Primary Examiner.*

NATHAN KAUFMAN, *Examiner.*